United States Patent
Nakatani et al.

(10) Patent No.: US 6,798,121 B2
(45) Date of Patent: Sep. 28, 2004

(54) MODULE WITH BUILT-IN ELECTRONIC ELEMENTS AND METHOD OF MANUFACTURE THEREOF

(75) Inventors: Seiichi Nakatani, Osaka (JP); Yoshihiro Bessho, Osaka (JP); Yasuhiro Sugaya, Osaka (JP); Keiji Onishi, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/979,374

(22) PCT Filed: Mar. 14, 2001

(86) PCT No.: PCT/JP01/02025
§ 371 (c)(1),
(2), (4) Date: Nov. 16, 2001

(87) PCT Pub. No.: WO01/69670
PCT Pub. Date: Sep. 20, 2001

(65) Prior Publication Data
US 2002/0159242 A1 Oct. 31, 2002

(30) Foreign Application Priority Data
Mar. 17, 2000 (JP) ........................................ 2000-076093

(51) Int. Cl.⁷ .............................................. H01L 41/08
(52) U.S. Cl. .................. 310/340; 310/313 R; 310/312; 310/346
(58) Field of Search ................................. 310/312, 340, 310/346, 344, 348, 313 R

(56) References Cited

U.S. PATENT DOCUMENTS

| | | |
|---|---|---|
| 5,484,647 A | 1/1996 | Nakatani et al. |
| 5,969,461 A * | 10/1999 | Anderson et al. ........ 310/313 R |
| 6,038,133 A | 3/2000 | Nakatani et al. |
| 6,300,686 B1 | 10/2001 | Hirano et al. |
| 6,310,421 B2 * | 10/2001 | Morishima .............. 310/313 R |
| 6,467,139 B1 * | 10/2002 | Tanaka ...................... 29/25.35 |

FOREIGN PATENT DOCUMENTS

| | | |
|---|---|---|
| EP | 0 568 930 A2 | 11/1993 |
| EP | 1 154 474 | 11/2001 |
| JP | 2-31437 | 2/1990 |
| JP | 2-186662 | 7/1990 |
| JP | 5-55303 | 3/1993 |
| JP | 6-268345 | 9/1994 |
| JP | 7-14764 | 6/1995 |
| JP | 9-260432 | 10/1997 |
| JP | 11-26642 | 1/1999 |
| JP | 11-67979 | 3/1999 |
| JP | 11-168112 | 6/1999 |
| JP | 11-220262 | 8/1999 |
| JP | 2000-260817 | 9/2000 |
| JP | 2001-057404 | 2/2001 |
| JP | 2001-060658 | 3/2001 |

* cited by examiner

Primary Examiner—Mark Budd
(74) Attorney, Agent, or Firm—Merchant & Gould, P.C.

(57) ABSTRACT

At least two electric elements (203) such as semiconductor chips or surface acoustic wave devices are mounted on wiring patterns (201), and the electric elements (203) are sealed with a thermosetting resin composition (204). An upper surface of the at least two electric elements (203) and an upper surface of the thermosetting resin composition (204) are abraded at the same time, thereby forming surfaces substantially flush with each other. Since they are abraded while being sealed with the thermosetting resin composition (204), it is possible to reduce the thickness without damaging the electric elements (203). Also, the electric elements (203) and the wiring patterns (201) can be prevented from being contaminated by an abrasive liquid. In this manner, it is possible to obtain an electric element built-in module whose thickness can be reduced while maintaining its mechanical strength.

15 Claims, 7 Drawing Sheets

MODULE WITH BUILT-IN ELECTRONIC ELEMENTS AND METHOD OF MANUFACTURE THEREOF

TECHNICAL FIELD

The present invention relates to a module containing electric elements such as semiconductor chips or surface acoustic wave devices. In particular, the present invention relates to an electric element built-in module that can be made ultra-thin and is suitable for a high-density packaging. In addition, the present invention relates to a method for manufacturing such an electric element built-in module.

BACKGROUND ART

In recent years, with the demand for higher performance and miniaturization of electronic equipment, higher density and higher function for packages in which semiconductor chips are mounted have been desired increasingly. Furthermore, there also is an increasing demand for smaller and higher-density circuit boards on which they are mounted. However, with conventional multilayered circuit boards including glass fiber and an epoxy resin (glass-epoxy multilayered circuit boards) having a penetrating through hole structure formed by drilling, it has become difficult to achieve the high-density packaging. Accordingly, instead of the conventional glass epoxy multilayered circuit boards, circuit boards that allow a connection not by the penetrating through hole but by an inner via hole have been developed actively (for example, JP 6(1994)-268345 A and JP 7(1995)-147464 A).

However, with the current state of the art, even the high-density mounted circuit boards having such an inner via hole structure cannot keep up with the miniaturization of the semiconductor chips. For example, although the pitch of lead electrodes has become as fine as about 50 μm as the wiring of the semiconductor chips becomes finer, the wiring pitch of the circuit boards and the via hole pitch still are about 100 μm. Therefore, the space for leading out the electrodes from the semiconductor chips increases, thus becoming an obstacle to miniaturization of the semiconductor packages.

Also, since the circuit boards are formed with a resin-based material, they have a low thermal conductivity. Thus, as the component packaging achieves a higher density, it becomes more difficult to dissipate heat that is generated from these components. The clock frequency of CPUs is expected to become about 1 GHz in the year 2000, and with the accompanying higher function thereof, the power consumption of the CPUs is expected to reach 100 to 150 W per a chip.

Furthermore, along with the increase in speed and density, it has become difficult to ignore the influence of noise.

Therefore, in circuit boards, not only the improvement of density and function resulting from a finer circuitry but also anti-noise characteristics and heat dissipation characteristics have to be taken into account.

On the other hand, as a form of responding to the miniaturization of the semiconductor chips described above, a chip size package (CSP) has been suggested. In this CSP, a semiconductor chip is flip-chip mounted on a circuit board called an interposer whose back surface has grid electrodes formed two-dimensionally thereon, and electrodes of the semiconductor chip and the grid electrodes are connected via via holes in the circuit board. This makes it possible to lead out the electrodes of the semiconductor chip that have been formed to have a pitch of not more than 100 μm from the grid electrodes having a pitch of about 0.5 to 1.0 mm, allowing an increase in the pitch of the lead electrodes.

As a result, the need for the finer circuit board on which the CSP is mounted has somewhat reduced, and thus inexpensive circuit boards can be used. Moreover, there is an advantage that the CSP can be used as a tested semiconductor package whose reliability is guaranteed. Consequently, compared with a bare chip technique in which a semiconductor bare chip is mounted on a circuit board directly, the cost required for testing chip damages and defective elements and for ensuring the reliability can be reduced while achieving the miniaturization, which is an advantage of the bare chip mounting.

The development of the CSP described above contributes to an advancement of the miniaturization of the semiconductor package.

On the other hand, in information terminals represented by a mobile personal computer and a mobile phone that can deal with information personally thanks to the development of the internet, the demand for smaller and thinner equipment has been intensified. The typical equipment includes a card-size information terminal, in particular. For example, it is expected to be applied more broadly to card-size radio equipment, a mobile phone, a personal identification card and a memory card for music delivery other than to a current credit card. Thus, a thin semiconductor package or active component that can be mounted on the card-size information terminal mentioned above is desired strongly.

When the above-described CSP is used for achieving a thinner semiconductor package, the bump height in the case of flip-chip mounting, or the wire height and the thickness of a sealing resin in the case of wire bonding, will be added to the thickness of the semiconductor chip (about 0.4 mm) and that of the interposer as the circuit board, resulting in the total thickness of about 0.7 mm. Since the total thickness required for the card-size equipment is about 0.3 to 1.0 mm, the semiconductor package has to be still thinner.

The thickness of the semiconductor package can be reduced by TAB (tape automatic bonding) mounting. An opening and a wiring pattern made of a copper foil are formed on a tape-like film of such as polyimide, a semiconductor chip is mounted in the opening, and electrodes protruding toward the opening directly are bonded to electrodes of the semiconductor chip (inner lead bonding). Similarly, electrodes are led out by connecting electrodes protruding from the tape with the circuit board (outer lead bonding). In this manner, the semiconductor package having a thickness substantially equal to the tape thickness (about 100 μm) can be obtained. In some cases, the form of superimposing multiple layers of this TAB mounted product also is suggested.

In any methods, it is needless to say that the semiconductor chip should be as thin as possible, but since the one (a silicon semiconductor, in particular) with a thickness of not more than 100 μm has a poor mechanical strength, such a semiconductor chip sometimes is damaged during the flip-chip mounting, in which a load is applied. Also, when a semiconductor wafer is abraded to be thinner, its mechanical strength decreases, so that the wafer is more likely to break in a later dicing. On the other hand, after being subjected to dicing, it is extremely difficult and economically inefficient to abrade a small semiconductor chip to be thinner.

On the other hand, the thickness of the semiconductor chip can be reduced by prior dicing. In the prior dicing, the semiconductor wafer is diced halfway of its thickness from one surface, and then is abraded from the other surface until reaching the diced portion. This method can provide a semiconductor chip that is cut automatically after abrading. However, even with this method, because each of the semiconductor chips is thin, a load cannot be applied thereto, leading to a difficulty in dealing at the time of mounting.

Also, in the mobile phone or the like, a surface acoustic wave device is used as a component part of a filter for extracting a specific frequency component.

FIG. 7 is a sectional view showing one example of a structure of a conventional surface acoustic wave device built-in module including two surface acoustic wave devices having a filter function. This module is used as, for example, an antenna duplexer used in a radio portion of a mobile phone or the like.

In FIG. 7, numeral 601 denotes surface acoustic wave devices, numeral 602 denotes piezoelectric substrates, numeral 603 denotes comb-shaped electrodes, numeral 604 denotes lead-out electrodes, and numeral 605 denotes metal bumps. Numeral 607 denotes a circuit board, numeral 609 denotes first wiring patterns, numeral 610 denotes second wiring patterns, numeral 611 denotes via holes, numeral 612 denotes a cover, numeral 613 denotes a sealant, numeral 614 denotes internal circuits, and numeral 615 denotes a concave portion.

In the surface acoustic wave device 601, on one surface of the piezoelectric substrate 602 formed of, for example, lithium tantalate, lithium niobate or quartz, the comb-shaped electrode 603 and the lead-out electrodes 604 formed of a metal film containing aluminum as a main component are formed. The metal bumps 605 for an electrical connection with an external circuit are formed on the lead-out electrodes 604.

The circuit board 607 has the first wiring patterns 609 on one surface, the second wiring patterns 610 on the other surface and the internal circuits 614 therein. The first wiring pattern 609, the second wiring pattern 610 and the internal circuit 614 are connected by the via holes 611. A plurality of the surface acoustic wave devices 601 built into the module shown in FIG. 7 and the external circuit are connected via these elements. In order to ensure a space in which the surface acoustic wave devices 601 are mounted, the circuit board 607 has the concave portion 615 in its central portion.

After the surface acoustic wave devices 601 are positioned and placed on the circuit board 607, the first wiring patterns 609 and the metal bumps 605 are electrically connected. When gold bumps are used as the metal bumps 605, heat and ultrasonic wave are used in combination so as to melt the metal bumps 605 for the connection. Alternatively, there also is a case of making the connection using an electrically conductive adhesive. Also, when solder bumps are used as the metal bumps 605, the connection is made by reflowing the solder bumps.

Since the surface acoustic wave device 601 is sensitive to an influence of an external atmosphere, the concave portion 615 of the circuit board 607 finally is sealed airtightly with, for example, the cover 612 formed of a metal plate and the sealant 613 formed of a solder or an adhesive. In this manner, the surface acoustic wave device built-in module used for an antenna duplexer or the like is obtained.

In the above description, as the piezoelectric substrate 602 constituting the surface acoustic wave device 601, a wafer having a thickness of 0.3 to 0.4 mm is used normally. Thus, the conventional surface acoustic wave device built-in module has a thickness of about 1 mm, making it difficult to reduce the thickness of electronic equipment represented by a mobile phone.

Accompanying a rapid advancement of mobile communication equipment in recent years, a still thinner module has been required, leading to an increase in demand for reducing the thickness of the piezoelectric substrate 602. However, since a single crystal material such as lithium tantalate, which is used as the piezoelectric substrate 602, is brittle and easy to break, it is very difficult to use the piezoelectric substrate 602 as thin as, for example, about 0.2 mm in practice during wafer transportation in a photolithography process for forming the comb-shaped electrode on the piezoelectric substrate 602 and when dealing with each of the devices in a process of mounting it on the circuit board 607. Furthermore, in the surface acoustic wave device 601, a commonly used technique is that the surface (the surface on a nonfunctional portion side) opposite to that on which the comb-shaped electrode 603 is formed (the surface on a functional portion side) is roughened so as to prevent a deterioration in characteristics caused by a reflection of an elastic wave from the surface on the nonfunctional portion side. When attempting to reduce the thickness of the piezoelectric substrate 602, the wafer is more likely to break also in this process of roughening the surface on the nonfunctional portion side. Accordingly, with the conventional structure, a thinner component built-in module using the surface acoustic wave device has been difficult to achieve.

DISCLOSURE OF INVENTION

It is an object of the present invention to solve the conventional problems described above and to provide a thin and mechanically strong module containing electric elements such as semiconductor chips or surface acoustic wave devices. It also is an object of the present invention to provide a method for manufacturing such an electric element built-in module effectively.

In order to achieve the above-mentioned objects, the present invention has the following structure.

An electric element built-in module according to the present invention includes a wiring pattern, at least two electric elements mounted on the wiring pattern, and a thermosetting resin composition for sealing the electric elements. Upper surfaces of the at least two electric elements and an upper surface of the thermosetting resin composition are substantially flush with each other.

This improves a mechanical strength because the electric elements are sealed with the thermosetting resin composition. Also, such a module can be obtained by grinding or abrading the upper surfaces of the electric elements and the upper surface of the thermosetting resin composition at the same time to achieve a desired thickness. In this case, since the electric elements are sealed with the thermosetting resin composition, the electric elements are not damaged by an external force during the processing. Thus, it is possible to provide a thin electric element built-in module that has a mechanical strength. Also, because at least two electric elements are provided, a high density module mounting can be achieved. Furthermore, by dividing the module by each of the electric elements, it is possible to provide a thin electric element built-in package that has mechanical strength.

In the electric element built-in module described above, it is preferable that at least one (more preferably, all) of the electric elements includes a functional portion and a connection electrode on a surface on a side of the wiring pattern, and the connection electrode is connected to the wiring pattern. This makes it possible to grind or abrade the surface opposite to the side of the wiring pattern of the electric element (the surface on a nonfunctional portion side). Thus, a thin module having a desired thickness can be provided.

Also, in the electric element built-in module described above, at least one of the electric elements may be at least one element selected from the group consisting of a semiconductor chip, a chip resistor, a chip capacitor and a chip inductor.

Alternatively, in the electric element built-in module described above, at least one of the electric elements may be a surface acoustic wave device.

When using the surface acoustic wave device as the electric element, it is preferable that a surface of the surface acoustic wave device on the side of the wiring pattern is provided with a functional portion and a space holding structure for preventing excitation and propagation of a surface elastic wave from being obstructed in the functional portion. The surface of the surface acoustic wave device on the functional portion side faces the wiring pattern, and therefore, the surface on the nonfunctional portion side can be ground or abraded. Thus, it is possible to provide a thin module having a desired thickness. Also, by providing the space holding structure, it is possible to fill a resin between the functional portion and the wiring pattern, thus improving the mechanical strength. Consequently, it is possible to prevent damages owing to an external force during processing for reducing the thickness.

It is preferable that the space holding structure is formed of a film-like resin composition. This improves an adhesion to a sealing resin, thereby obtaining a highly reliable module.

Also, in the electric element built-in module described above, it is preferable that the upper surfaces of the at least two electric elements both have a surface roughness Rz of 0.5 to 50 $\mu$m. Furthermore, it is preferable that the upper surfaces of the at least two electric elements and the upper surface of the thermosetting resin composition that are substantially flush with each other both have a surface roughness Rz of 0.5 to 50 $\mu$m. In this case, the surface roughness Rz denotes a mean roughness of ten points. The surface roughness Rz of smaller than 0.5 $\mu$m causes breakage of a connected portion of the electric elements and the wiring pattern owing to the above-described processing of the upper surfaces and cracking at an interface between the electric elements and the resin composition. On the other hand, the surface roughness Rz of larger than 50 $\mu$m brings about breakage and cracking of the electric elements. Furthermore, when using the surface acoustic wave device as the electric element, the surface roughness Rz that is out of the above range deteriorates frequency characteristics.

Moreover, in the electric element built-in module described above, it is preferable that the thermosetting resin composition contains an inorganic filler and a thermosetting resin. By selecting the inorganic filler and the thermosetting resin, it is possible to achieve a module having a desired performance.

It is preferable that the thermosetting resin contains an epoxy resin, a phenolic resin or a cyanate resin as a main component. This is because these resins have excellent heat resistance and insulation reliability.

Also, it is preferable that the inorganic filler is at least one inorganic filler selected from the group consisting of $Al_2O_3$, MgO, BN, AlN and $SiO_2$. This is because various performances of the module can be secured. By changing materials for the inorganic filler, it becomes possible to control a coefficient of thermal expansion, a thermal conductivity and a dielectric constant of the thermosetting resin composition. When using $Al_2O_3$, it is possible to achieve a module that has a reduced coefficient of thermal expansion and an excellent thermal conductivity. When using $SiO_2$, the dielectric constant can be controlled, and the coefficient of thermal expansion also can be reduced. By selecting the other materials of AlN, MgO or BN, it is possible to achieve a module having a still better thermal conductivity.

For example, by bringing the coefficient of thermal expansion of the resin composition substantially equal to that of the electric element, the cracking and the deterioration in connection reliability due to a temperature change can be prevented. Also, by raising the thermal conductivity of the resin composition, heat dissipation characteristics can be improved when an electronic component is a semiconductor chip requiring heat dissipation. Moreover, by lowering the dielectric constant of the resin composition, it is possible to reduce a high-frequency loss. In the module of the present invention, another electric element can be mounted on the wiring pattern on the side opposite to the sealed electric elements. In this case, the inorganic filler contained in the thermosetting resin composition also can be selected according to characteristics required for this another electric element.

Also, in the electric element built-in module described above, the wiring pattern may be formed on a surface of a circuit board. This makes it possible to obtain a circuit board efficiently on which thin electric elements are mounted.

Alternatively, the wiring pattern may be formed on a surface of a support. By peeling off the support, it is possible to obtain an electric element built-in package that can be mounted on a wiring board or the like. Alternatively, on the exposed wiring pattern, other electric elements can be mounted.

In this case, it is preferable that the support is formed of an organic film or a metal foil.

Furthermore, in the electric element built-in module described above, it is preferable that at least one of the electric elements is connected to the wiring pattern via a bump. This can achieve a highly reliable electrical connection in an efficient manner.

Next, a method for manufacturing an electric element built-in module of the present invention includes mounting at least one electric element, one of whose surface is provided with a functional portion and a connection electrode, on a wiring pattern so that the one surface faces the wiring pattern, sealing the electric element with a thermosetting resin composition from a side of the other surface of the electric element, and grinding or abrading the electric element sealed with the thermosetting resin composition from the side of the other surface of the electric element.

According to the above method, a thick electric element is mounted, sealed with the thermosetting resin composition, and then ground or abraded from the surface on the nonfunctional portion side. Since the electric element is reinforced by the resin composition, it is possible to alleviate a mechanical impact and load applied to the electric element during grinding or abrading. Thus, a thin electric element built-in module can be obtained without breaking the electric element. In addition, since the electric element is sealed with the resin composition during grinding or abrading, it is possible to prevent contamination of the electric element and an electrically connected portion.

In the above-described method for manufacturing the electric element built-in module, it is preferable that a bump is formed on the connection electrode of the electric element, and the electric element is mounted on the wiring pattern using the bump and an electrically conductive adhesive. This makes it possible to perform processing at a temperature lower than that in the case of a solder connection.

Alternatively, in the above-described method for manufacturing the electric element built-in module, a bump is formed on the connection electrode of the electric element, and the electric element may be mounted on the wiring pattern using the bump and a sheet in which an electrically conductive filler is dispersed. This eliminates the need for a process of filling a sealing resin between the electric element and the wiring pattern. In addition, it also is possible to address a fine connection pitch.

Alternatively, in the above-described method for manufacturing the electric element built-in module, a bump is formed on the connection electrode of the electric element, and the electric element may be mounted on the wiring pattern by connecting the bump and the wiring pattern in an ultrasonic manner. This makes it possible to reduce a thermal load on the electric element.

Also, in the above-described method for manufacturing the electric element built-in module, it is preferable further to include filling and curing a resin between the electric element and the wiring pattern, after mounting the electric element on the wiring pattern and before sealing the electric element with the thermosetting resin composition. This makes it possible to protect a connected portion of the electric element and the wiring pattern with the sealing resin (what is called an underfill). Also, the electric element and the connected portion can be prevented from being damaged by a pressure applied in a subsequent process of sealing with the thermosetting resin composition.

Moreover, in the above-described method for manufacturing the electric element built-in module, the electric element can be sealed with the thermosetting resin composition by overlaying an uncured sheet-like object formed of the thermosetting resin composition onto the other surface of the electric element, followed by heating and compression. This makes it possible to seal the electric element with the thermosetting resin composition by a simple process.

Alternatively, in the above-described method for manufacturing the electric element built-in module, the electric element also can be sealed with the thermosetting resin composition by applying an uncured paste-like object formed of the thermosetting resin composition from the other surface of the electric element under a vacuum or a reduced pressure, followed by heating. By applying the paste-like object under a vacuum or a reduced pressure, the paste-like object can be filled thoroughly.

It is preferable that the heating after applying the paste-like object is carried out at an atmospheric pressure or larger. This can reduce voids in the thermosetting resin composition.

In the above method, when the electric element is sealed by overlaying the uncured sheet-like object onto the other surface of the electric element, followed by heating and compression, it is preferable that a temperature of the heating is equal to or lower than a cure starting temperature of the thermosetting resin contained in the resin composition. This can reduce a pressure during the compression. Also, since the thermosetting resin is in the uncured state, the subsequent grinding or abrading becomes easier.

Similarly, when the electric element is sealed by applying the uncured paste-like object from the other surface of the electric element, followed by heating, it is preferable that a temperature of the heating is equal to or lower than a cure starting temperature of the thermosetting resin contained in the resin composition. This can reduce voids remaining in the resin composition. Also, since the thermosetting resin is in the uncured state, the subsequent grinding or abrading becomes easier.

Also, in the above-described method for manufacturing the electric element built-in module, it is preferable that the thermosetting resin composition contains at least 70 wt % to 95 wt % of an inorganic filler and 5 wt % to 30 wt % of a thermosetting resin. By selecting suitably a type of the inorganic filler that is contained with a high concentration, a module having a desired performance can be obtained. For example, by bringing the coefficient of thermal expansion of the resin composition substantially equal to that of the electric element, it is possible to obtain a module that is highly resistant to temperature changes. Also, by improving the heat dissipation characteristics of the resin composition, it is possible to obtain a module that is suitable for an electric element generating a large amount of heat. Moreover, by using an inorganic filler with a low dielectric constant, it is possible to obtain a module having excellent high-frequency characteristics.

Furthermore, the above-described method for manufacturing the electric element built-in module further may include making a division into a desired shape, after grinding or abrading the electric element sealed with the thermosetting resin composition. The thickness is reduced while maintaining a large size, and then the division is made, thus making it possible to produce a thin low-cost electric element package in an efficient manner.

Moreover, in the above-described method for manufacturing the electric element built-in module, the wiring pattern may be formed on a surface of a circuit board. This makes it possible to obtain a circuit board efficiently on which thin electric elements are mounted.

Alternatively, in the above-described method for manufacturing the electric element built-in module, the wiring pattern may be formed on a surface of a support. In this case, an organic film or a metal foil can be used as the support.

In this case, the above-described method further may include peeling off the support, after grinding or abrading the electric element sealed with the thermosetting resin composition. By peeling off the support, it is possible to obtain an electric element built-in package that can be mounted on the circuit board. Alternatively, other electric elements can be mounted on the wiring pattern that is exposed by the peeling off. Since the support is peeled off after the grinding or abrading, the electric element and the wiring pattern can be prevented from being contaminated during the grinding or abrading.

The above-described method further may include, after peeling off the support, forming a wiring pattern by laminating a prepreg for a circuit board provided with a through hole in a thickness direction filled with an electrically conductive paste and a metal foil in this order on a surface on a side of the wiring pattern exposed by the peeling, followed by heating and compression, and then etching the metal foil. This makes it possible to obtain a module having a multilayered structure provided with an inner via hole.

Alternatively, the above-described method further may include, after sealing the electric element with the thermosetting resin composition and before grinding or abrading the electric element sealed with the thermosetting resin composition, peeling off the support, and forming a wiring pattern by laminating a prepreg for a circuit board provided with a through hole in a thickness direction filled with an electrically conductive paste and a metal foil in this order on a surface on a side of the wiring pattern exposed by the peeling, followed by heating and compression, and then etching the metal foil. This makes it possible to obtain a module having a multilayered structure provided with an inner via hole.

The above-described method further may include, after forming the wiring pattern by etching the metal foil, forming at least one second wiring pattern by laminating a prepreg for a circuit board provided with a through hole in a thickness direction filled with an electrically conductive paste and a second metal foil in this order on a surface on a side of the wiring pattern obtained by the etching, followed by heating and compression, and then etching the second metal foil. This makes it possible to obtain a module having a further multilayered structure provided with an inner via hole.

Also, in the above-described method for manufacturing the electric element built-in module, it is preferable that the electric element and the thermosetting resin composition are ground or abraded at the same time so as to be substantially flush with each other. By grinding or abrading them at the same time, a thin module can be obtained easily. In addition, the electric element and the connected portion of the electric element and the wiring pattern can be prevented from being damaged during the grinding or abrading.

Moreover, in the above-described method for manufacturing the electric element built-in module, it is preferable that the grinding or abrading is carried out by an abrading method using an abrasive. In this manner, it is possible to apply a lapping process, which generally is used in a manufacturing process of semiconductor chips, to the manufacturing method of the present invention, and therefore existing facilities can be utilized.

BEST MODE FOR CARRYING OUT THE INVENTION

The following is a description of an electric element built-in module and a method for manufacturing the same according to the present invention, with reference to the accompanying drawings.

(First Embodiment)

Figure 1:
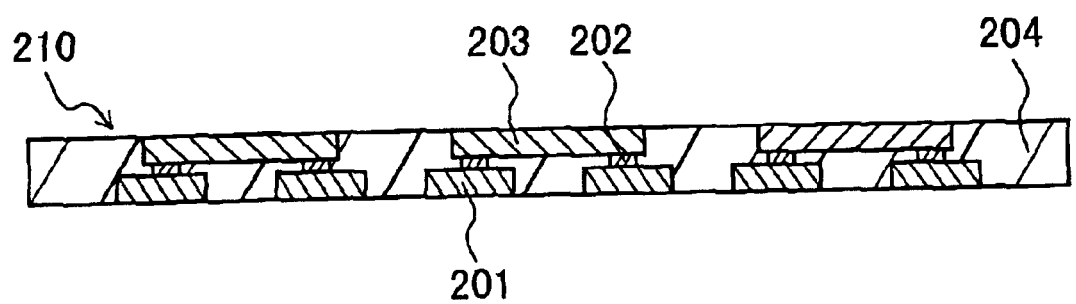
FIG. 1 is a sectional view showing a structure of a semiconductor chip built-in module according to a first embodiment of the present invention.

FIG. 1 is a sectional view showing a structure of an electric element built-in module according to the first embodiment of the present invention, in which semiconductor chips are contained as electric elements. In FIG. 1, numeral 204 denotes a mixed resin composition containing an inorganic filler and a thermosetting resin, numeral 203 denotes semiconductor chips that are sealed with the resin composition 204 and formed into one piece, numeral 201 denotes a wiring pattern, numeral 202 denotes metal bumps, and numeral 210 denotes a semiconductor chip built-in module of the first embodiment.

The semiconductor chip 203 is provided with a functional portion for presenting its function on one surface, and an electrode pad (a connection electrode) is formed on a surface on the side of the functional portion. The bumps 202 are formed on the electrode pad of the semiconductor chip 203. The bumps 202 are connected to the wiring pattern 201, allowing a signal input/output with respect to the semiconductor chip 203.

A surface opposite to the functional portion of the semiconductor chips 203 and an upper surface of the mixed resin composition 204 in which the semiconductor chips 203 are sealed and embedded are ground or abraded at the same time so as to be substantially flush with each other. This makes it possible to reduce the overall thickness.

Since it is possible to contain the semiconductor chips 203 and reduce the thickness by grinding or abrading the upper surface as shown in FIG. 1, a thin and high-density module that is suitable for a thin product such as a memory card can be obtained.

As the thermosetting resin contained in the mixed resin composition 204, an epoxy resin, a phenolic resin or a cyanate resin can be used, for example. Also, as the inorganic filler that is dispersed and contained, $Al_2O_3$, MgO, BN, AlN or $SiO_2$ can be used. If necessary, a coupling agent, a dispersing agent, a coloring agent and a releasing agent further can be added to the mixture of the inorganic filler and the thermosetting resin.

As the semiconductor chip 203, not only can a silicon semiconductor element, a bipolar element and a MOS element be used, but also a silicon-germanium semiconductor element and a gallium-arsenide semiconductor element that have a poor mechanical strength.

A copper foil can be used as the wiring pattern 201, and a copper foil plated with nickel or gold further is preferable because of its stable electrical connection with the metal bumps 202 on the semiconductor chip 203.

As the metal bump 202, it is possible to use a gold bump, which can be a two-stage protruding bump produced by a wire-bonding method or a gold-plated bump.

Next, a specific method for manufacturing the semiconductor chip built-in module described above will be explained with reference to FIGS. 2A to 2F.

FIGS. 2A to 2F are sectional views showing a process sequence in the method for manufacturing the semiconductor chip built-in module shown in FIG. 1.

Figure 2A:
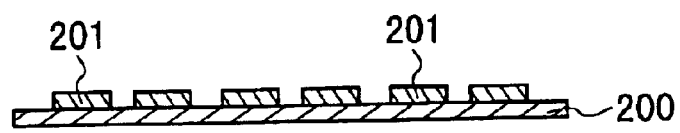
FIGS. 2A to 2F are sectional views showing a process sequence in a method for manufacturing the semiconductor chip built-in module shown in FIG. 1.

First, as shown in FIG. 2A, a support (a carrier) 200 formed of a metal foil, whose surface is provided with the wiring pattern 201, is prepared. As the support 200, a 50 to 100 µm thick copper foil that is easily transported and has an appropriate adhesive strength can be used.

The following is a specific production method. First, on the surface of the support 200 formed of the metal foil, copper further is plated so as to have a desired thickness. The thickness of the copper plating layer on the support 200 preferably is adjusted according to the fineness of the wiring pattern. The thickness of the copper plating layer may be 5 to 9 μm when forming a fine wiring pattern having a pitch of 100 μm, while that may be about 12 to 24 μm when the wiring pattern is not so fine.

Subsequently, the copper plating layer on the support 200 is etched by an existing method, thus forming the wiring pattern 201. At this time, only the copper plating layer can be etched, or the surface of the support 200 can be etched partially as well. This is because, in either case, only the copper plating layer to be the wiring pattern 201 is transferred to the module side in the end.

The metal foil is most suitably used for the support 200 because the wiring pattern 201 will not move owing to a resin flow in a later process of embedding the semiconductor chip into the thermosetting resin composition.

Figure 2B:
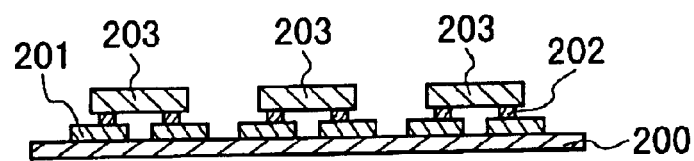

On the support 200 with the wiring pattern 201 produced as above, the semiconductor chips 203 are mounted as shown in FIG. 2B. The semiconductor chips 203 are provided with the functional portion and the electrodes on one surface. The semiconductor chips 203 are mounted on the wiring pattern 201 via the metal bumps such as gold bumps so that the side of the functional portion faces the wiring pattern 201. The mounting method may include making a connection by transferring an electrically conductive paste on the metal bumps 202 or mounting the semiconductor chips using solder.

Figure 2C:
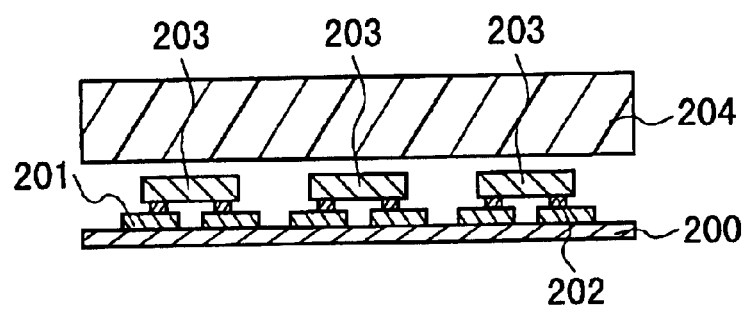

Next, as shown in FIG. 2C, a sheet-like object 204 formed of an uncured mixed resin composition containing the inorganic filler and the thermosetting resin is positioned and overlaid on the semiconductor chips 203.

The sheet-like object 204 of the thermosetting resin composition is obtained in the following manner.

First, a paste-like mixture is prepared by mixing an inorganic filler and a liquid thermosetting resin, or similarly, a paste-like mixture is prepared by mixing a thermosetting resin whose viscosity has been reduced by a solvent into an inorganic filler.

Subsequently, the paste-like mixture is formed to have a predetermined thickness and heat-treated, thus obtaining the sheet-like object. The heat-treatment is performed for the following reason. Since the mixture using the liquid resin is viscous, the curing is accelerated slightly so as to reduce the viscosity while maintaining flexibility in the uncured state. In the case of the mixture using the resin dissolved by the solvent, the heat-treatment is for removing the solvent and for reducing the viscosity while maintaining the flexibility in the uncured state.

Figure 2D:
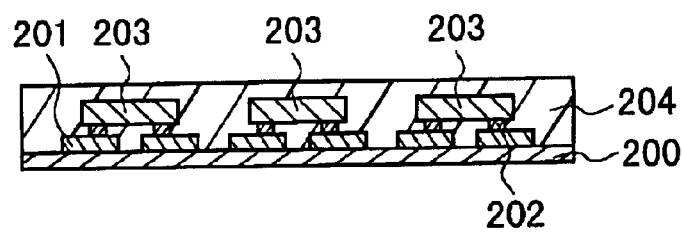

Thereafter, the support 200 on which the semiconductor chips 203 have been mounted and then the sheet-like object 204 is overlaid is heated and compressed into one piece. Thus, as shown in FIG. 2D, the semiconductor chips 203 are embedded into the sheet-like object 204, and the thermosetting resin contained in the sheet-like object 204 is cured, thereby sealing the semiconductor chips 203 and adhering the sheet-like object 204 to the wiring pattern 201. At this time, in order to promote the adhesion of the sheet-like object 204 to the wiring pattern 201, it is desirable that the surface of the copper plating layer constituting the wiring pattern 201 to be in contact with the sheet-like object 204 is roughened. Similarly, in order to improve the adhesion and prevent oxidation, the surface of the copper plating layer may be treated with the coupling agent or plated with tin, zinc, nickel or gold.

Figure 2E:
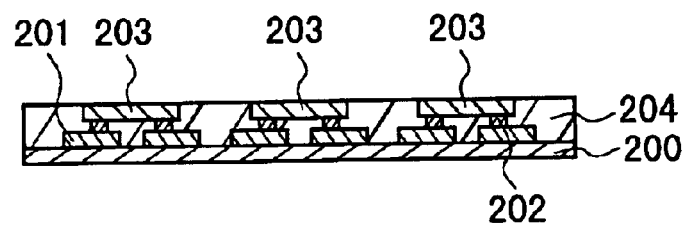

Next, as shown in FIG. 2E, the semiconductor chip 203—embedded object produced as above is ground or abraded from the surface opposite to the support 200 so as to have a predetermined thickness. For example, the above process includes lapping using abrasives (free grains), which is a technique commonly used when abrading semiconductor chips. Since the semiconductor chips 203 already are mounted and sealed with the sheet-like object 204, there is no damage caused by an impact during abrading and no contamination by an abrasive liquid. Also, since the support 200 is adhered to the opposing surface, there is no concern about contamination. By carrying out grinding or abrading while the semiconductor chips 203 are protected as described above, it is possible to obtain a semiconductor chip built-in module having a desired thickness. Although the thickness of a general semiconductor chip is about 0.4 mm, the thickness can be reduced to about 50 μm according to the present invention.

Figure 2F:
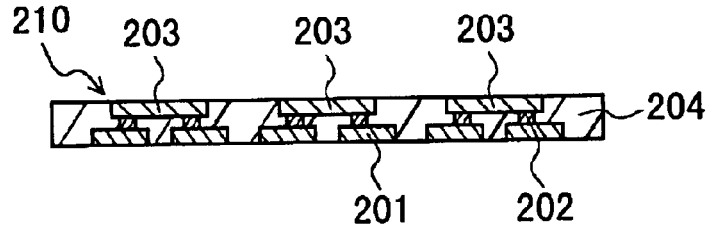

Subsequently, as shown in FIG. 2F, the support 200 is peeled off. Thus, a thin semiconductor chip built-in module 210 can be obtained. The above-described method produces a special effect of forming an extremely thin semiconductor package.

Figure 3A:
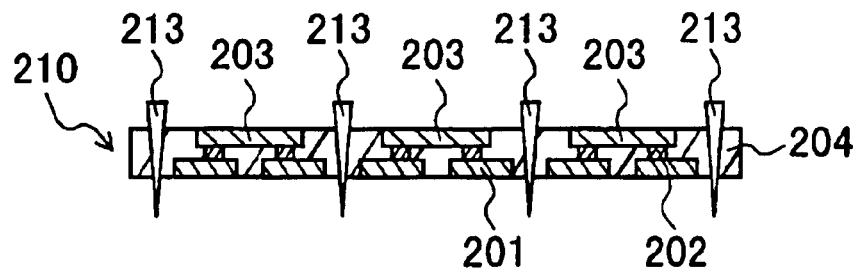
FIGS. 3A and 3B are sectional views showing a process sequence in a method for manufacturing a chip size package using the semiconductor chip built-in module shown in FIG. 1.
Figure 3B:
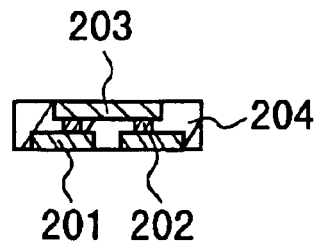

Furthermore, as shown in FIG. 3A, the semiconductor chip built-in module 210 may be cut at cutting positions 213 between the adjacent semiconductor chips 203. Thus, as shown in FIG. 3B, it is possible to obtain an extremely thin chip size package. For the cutting, a dicing apparatus used for processing the semiconductor chip can be used.

In the above embodiment, after the semiconductor chips 203 are flip-chip mounted as in FIG. 2B, it is preferable that a sealing resin (an underfill) is filled between the semiconductor chips 203 and the support 200 provided with the wiring pattern 201, followed by curing. This is because a damage to the semiconductor chips 203 can be reduced when overlaying the sheet-like object 204 so as to embed the semiconductor chips 203. An existing resin can be used as the sealing resin. For example, the use of a resin obtained by dispersing silica (silicon oxide) as an inorganic filler into a liquid epoxy resin is preferable because the coefficient of thermal expansion of the sealing resin can be matched with that of the semiconductor chip 203 and water-absorbance can be reduced.

Also, in the above embodiment, when the semiconductor chips 203 are mounted on the support 200 provided with the wiring pattern 201, it may be possible that an adhesive sheet in which an electrically conductive filler is dispersed is interposed between the semiconductor chips 203 and the support 200, followed by compressing the semiconductor chips 203 and the support 200 into one piece. The metal bumps 202 formed on the semiconductor chips 203 are dug into the adhesive sheet, and the metal bumps 202 and the wiring pattern 201 are electrically connected via the electrically conductive filler in the adhesive sheet only in a portion compressed by the metal bumps 202, Simultaneously, the semiconductor chips 203 and the support 200 also can be sealed. Thus, the process of mounting the semiconductor chips 203 and that of filing the underfill can be performed at the same time, thereby simplifying processes.

In the above embodiment, it is preferable that the heating and compressing process of embedding the semiconductor chips 203 using the sheet-like object 204 is carried out at a temperature not higher than a cure starting temperature of the thermosetting resin in the sheet-like object 204, and after the grinding or abrading process, a further heating is carried out so as to cure the thermosetting resin in the sheet-like object 204. This is because grinding or abrading before the sheet-like object 204 finishes curing allows an easier process. This shortens the time required for the grinding or abrading process.

Although the above embodiment illustrated the case of using copper as a material for the wiring pattern 201, the present invention is not limited to the above, so metal such as aluminum or nickel also may be used to produce a similar effect.

Also, in the above embodiment, the example of using the metal foil as the support 200 was described, but the support 200 is not limited to the above in the present invention. For example, an organic film can be used as the support 200. By using the organic film, which is an insulator, it is possible to test the performance of the semiconductor chips 203 and the connection between the semiconductor chips 203 and the wiring pattern 201 before the semiconductor chips 203 are sealed with the sheet-like object 204 (that is, in the state shown in FIG. 2B). In addition, the organic film can be reused by forming another wiring pattern after being peeled off.

As examples of a material for the organic film for the support 200, polyethylene, polyethylene terephthalate, polyethylene naphthalate, polyphenylene sulfide, polyimide or polyamide can be used. An organic film having a heat resistant temperature corresponding to a curing temperature of the thermosetting resin contained in the sheet-like object 204 may be selected suitably from the above materials. In particular, because of their excellent heat resistance, dimension stability and mechanical strength, polyphenylene sulfide, polyimide and polyamide are the most suitable for the organic film material for the support 200 of the present invention.

The following is a description of a specific method for manufacturing the wiring pattern 201 when using the organic film as the support 200. First, an adhesive layer is applied to one surface of the organic film, and a metal layer for the wiring pattern 201 is laminated thereon. Alternatively, the metal layer for the wiring pattern 201 may be formed on one surface of the organic film by plating. Subsequently, the metal layer is chemically etched, thus forming the wiring pattern 201.

Also, in the above embodiment, in order to embed and seal the mounted semiconductor chips 203 with the thermosetting resin composition from the surface on the nonfunctional portion side, the sheet-like object 204 formed of this resin composition was used. However, in the present invention, the method for sealing the semiconductor chips 203 is not limited to the above. For example, after being mounted as shown in FIG. 2B, the semiconductor chips 203 may be sealed by applying an uncured paste-like object formed of this resin composition by printing from the surface on the nonfunctional portion side of the semiconductor chip 203 under a vacuum or reduced-pressure atmosphere. Thereafter, the paste-like object is heated to be cured. The heating preferably is carried out in an atmosphere that is pressurized up to atmospheric pressure or larger.

By applying the paste-like object under a vacuum or reduced-pressure atmosphere, it is possible to fill the paste-like object sufficiently in a gap between the mounted semiconductor chips 203 and the wiring pattern 201. Also, by heating and curing the paste-like object under the atmosphere that is pressurized up to atmospheric pressure or larger, it is possible to eliminate minute voids generated when the paste-like object has been applied. Consequently, the functional portion of the mounted semiconductor chips can be protected completely with the resin, thereby obtaining an extremely reliable module.

The following is a description of a specific sealing method using the paste-like object. First, as shown in FIG. 2B, the semiconductor chips 203 are mounted on the wiring pattern 201. Then, the paste-like object is printed to seal the semiconductor chips 203 using a screen printing apparatus capable of maintaining a vacuum within a printing stage. The printing is carried out using a metal mask having an opening corresponding to a region to be printed and a thickness corresponding to a desired thickness of the thermosetting resin composition to be printed. This metal mask is overlaid on the surface on the nonfunctional portion side of the semiconductor chip 203. At this time, the metal mask is positioned so that the opening of the metal mask is located above the wiring pattern 201 and the support 200 that are not covered with the semiconductor chips 203. Thereafter, from above the metal mask, the paste-like object is printed while being pressed with a squeegee. This makes it possible to apply the paste-like object in the region corresponding to the opening of the metal mask, so as to have a thickness corresponding to the thickness of the metal mask. By carrying out this printing process under a vacuum or reduced-pressure atmosphere, it is possible to fill the paste-like object in a narrow gap between the semiconductor chips 203 and the wiring pattern 201. The degree of vacuum or reduced pressure appropriately is about 100 to 10,000 Pa. When it is 100 Pa or lower, a slight amount of a solvent contained in the paste-like object volatilizes, leading to an increase in voids in some cases. On the other hand, when it is 10,000 Pa or higher, the effect of removing voids deteriorates. It is preferable that the paste-like object slightly is heated during printing, so as to lower its viscosity. This is effective in removing voids. After printing the paste-like object, the paste-like object is cured in a pressurized oven capable of heating at a constant temperature. By filling a gas such as air or nitrogen, followed by heating, it is possible to raise the pressure inside the pressurized oven. A sample on which the paste-like object is printed is placed in a stainless container, so as to be heated and pressurized to a curing temperature of the paste-like object. This makes it possible to eliminate minute voids that have been present inside. The heating temperature varies depending on types of the resin contained in the paste-like object, and when using an epoxy resin, it is 150° C. to 200° C. The applied pressure most preferably is 0.5 to 1 MPa. The pressure equal to or lower than 0.5 MPa decreases the effect of removing voids, while that equal to or higher than 1 MPa sometimes causes a problem in pressure resistance of the container.

(Second Embodiment)

Figure 4A:
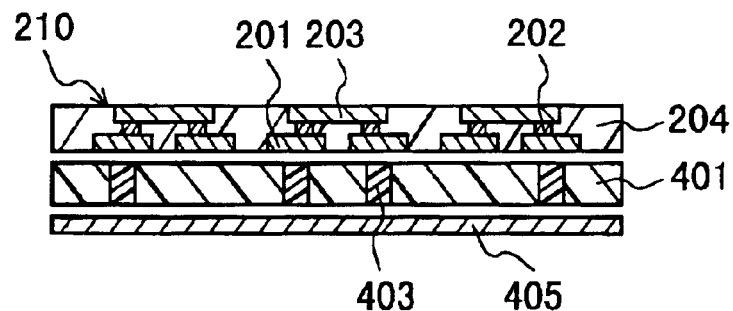
FIGS. 4A to 4C are sectional views showing a process sequence in a method for manufacturing a semiconductor chip built-in module according to a second embodiment of the present invention.
Figure 4B:
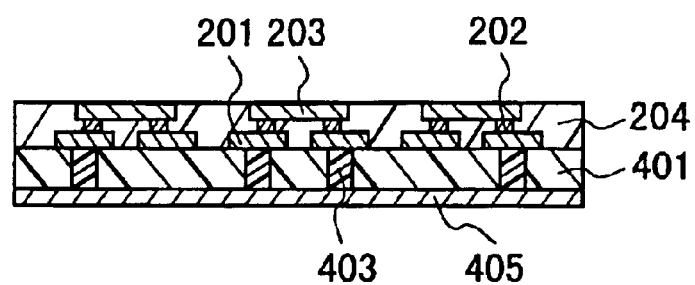
Figure 4C:
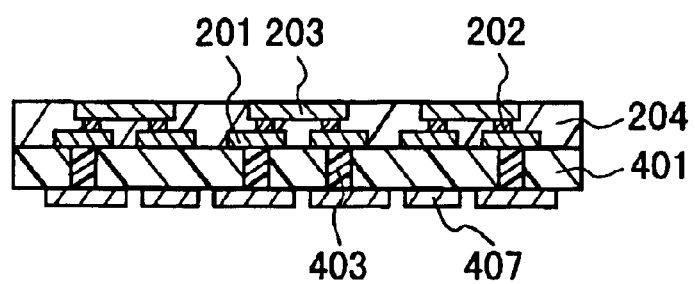

FIGS. 4A to 4C are sectional views showing a process sequence in a method for manufacturing a semiconductor chip built-in module according to the second embodiment of the present invention.

In FIG. 4A, numeral 210 denotes the semiconductor chip built-in module shown in FIG. 2F of the first embodiment, in which the same component parts as those in FIG. 2F have the same reference numerals. Numeral 401 denotes a prepreg for a circuit board, and numeral 403 denotes electrically conductive pastes filled in through holes that are formed in the prepreg 401 in a thickness direction. Numeral 405 denotes a metal (copper) foil.

As the prepreg 401 for the circuit board, it is possible to use an uncured base material (prepreg) obtained by impregnating a glass woven fabric with an epoxy resin as a thermosetting resin. Alternatively, it also is possible to use an aramid-epoxy prepreg obtained by impregnating an aramid nonwoven fabric with an epoxy resin or an organic film having thermosetting resin layers formed on both surfaces. Furthermore, it is preferable that an inorganic filler is contained in the thermosetting resin because the thermal conductivity and the coefficient of thermal expansion can be controlled.

As the electrically conductive paste 403, it is possible to use the mixture of gold, silver or copper powder as an electrically conductive material and a thermosetting resin such as an epoxy resin. Especially, copper is effective because of its excellent electrical conductivity and small migration. In addition, as the thermosetting resin, a liquid epoxy resin is preferable in terms of heat resistance.

As shown in FIG. 4A, the semiconductor chip built-in module 210, the prepreg 401 and the copper foil 405 are positioned and superimposed in this order, and then heated and compressed into one piece. The thermosetting resins in the prepreg 401 and the electrically conductive paste 403 are cured, thus obtaining a semiconductor chip built-in module having the structure as shown in FIG. 4B.

Finally, as shown in FIG. 4C, the copper foil 405 is etched so as to form a wiring pattern 407.

In the semiconductor chip built-in module produced as above, a fine circuit pattern can be formed with a multilayered wiring structure, allowing an extremely small and thin semiconductor package.

Moreover, the process of laminating the prepreg 401 and the copper foil 405 that are shown in FIG. 4A onto the surface of the module of FIG. 4C on the wiring pattern 407 side and then etching the copper foil 405 to form a wiring pattern is repeated a predetermined number of times, thereby achieving a still higher-density multilayered module.

In the first and second embodiments above, the module containing the semiconductor chips was described as an example. However, the module of the present invention can contain an electric element other than the semiconductor chip, for example, a chip resistor, a chip capacitor, a chip inductor or a surface acoustic wave device.

Next, the module containing the surface acoustic wave device will be described.

(Third Embodiment)

The following is a description of an embodiment of a module containing surface acoustic wave devices as electric elements, using the accompanying drawings.

Figure 5:
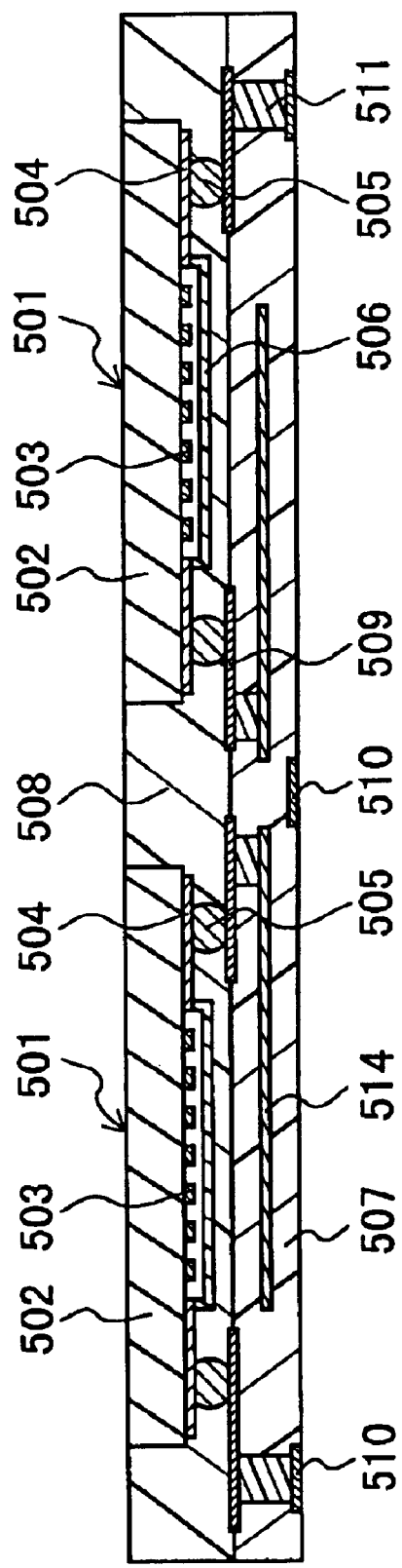
FIG. 5 is a sectional view showing a structure of a surface acoustic wave device built-in module according to a third embodiment of the present invention.
Figure 6A:
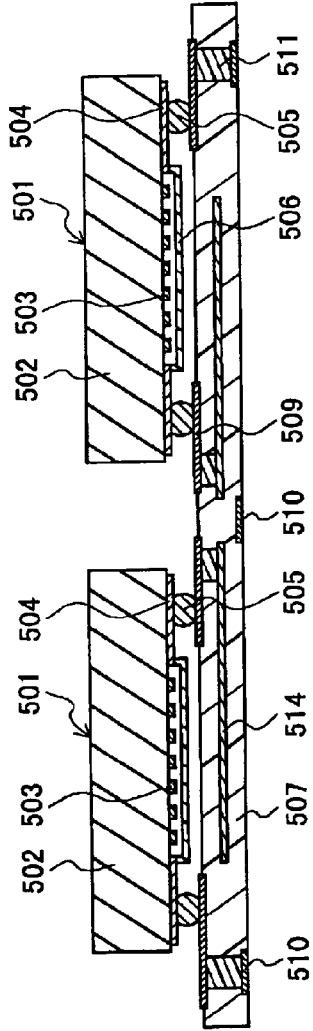
FIGS. 6A to 6C are sectional views showing a process sequence in a method for manufacturing the surface acoustic wave device built-in module shown in FIG. 5.
Figure 6B:
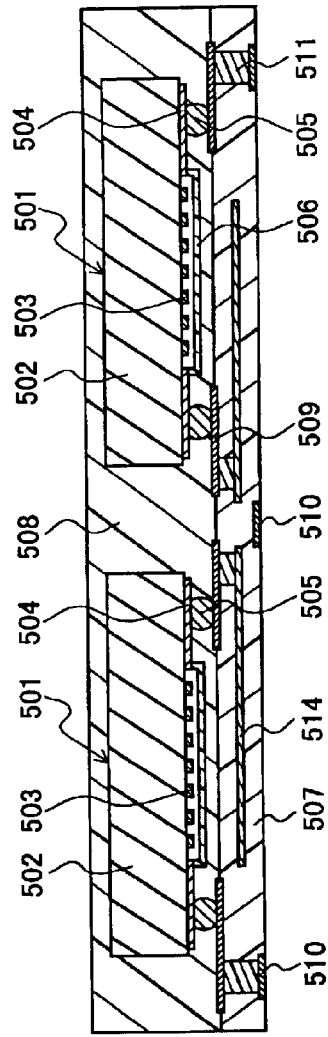
Figure 6C:
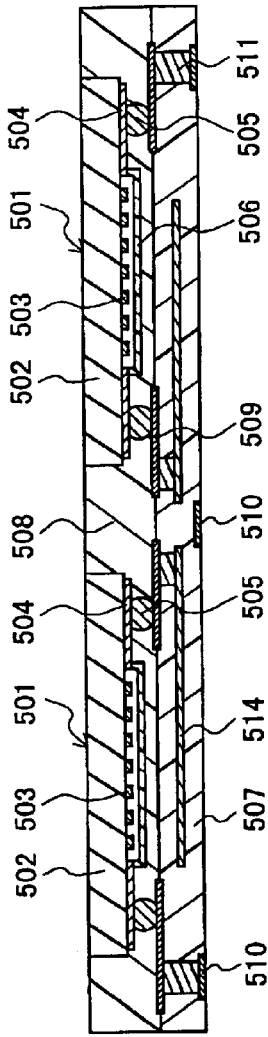

FIG. 5 is a sectional view showing an electric element built-in module according to the third embodiment, using a surface acoustic wave device as an electric element. Also, FIGS. 6A to 6C are sectional views showing a process sequence in a method for manufacturing the electric element built-in module shown in FIG. 5. In FIG. 5 and FIGS. 6A to 6C, numeral 501 denotes surface acoustic wave devices, numeral 502 denotes piezoelectric substrates, numeral 503 denotes comb-shaped electrodes, numeral 504 denotes lead-out electrodes, numeral 505 denotes metal bumps, and numeral 506 denotes holding bodies. Numeral 507 denotes a circuit board, numeral 508 denotes a thermosetting resin composition, numeral 509 denotes first wiring patterns, numeral 510 denotes second wiring patterns, numeral 511 denotes via holes, and numeral 514 denotes internal circuits.

Figure 7:
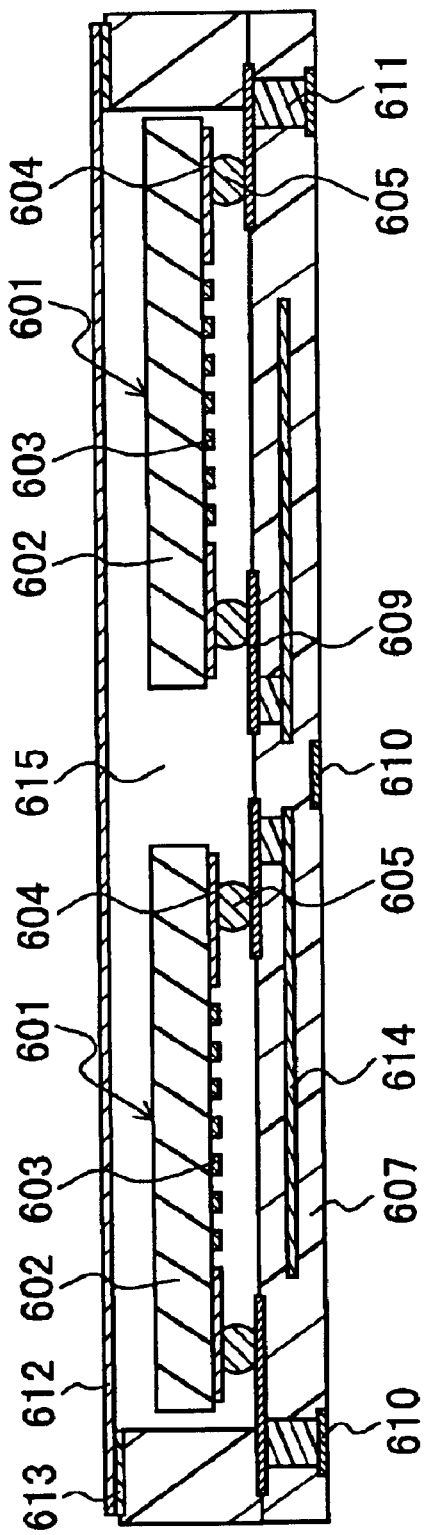
FIG. 7 is a sectional view showing a structure of a conventional electric element built-in module containing two surface acoustic wave devices.

In the surface acoustic wave device 501, on one surface (the surface on a functional portion side) of the piezoelectric substrate 502 formed of, for example, lithium tantalate, lithium niobate or quartz, the comb-shaped electrode 503 and the lead-out electrodes 504 formed of a metal film containing aluminum as a main component are formed as in the conventional surface acoustic wave device shown in FIG. 7. The holding body 506 for securing a vibration space is formed on the functional portion in which a surface elastic wave is propagated. The holding body 506 forms a space holding structure so that the functional portion does not contact other members directly to obstruct the propagation of the surface elastic wave. Such a holding body 506 can be constituted by a supporting layer and a cover body that are formed of a film-like resin composition as shown in, for example, JP 10(1998)-270975 A.

A surface on the side opposite to the functional portion of the surface acoustic wave device 501 and an upper surface of the resin composition 508 for sealing the surface acoustic wave device 501 are ground or abraded at the same time so as to be substantially flush with each other. This makes it possible to reduce the overall thickness.

Materials for the piezoelectric substrate 502, the comb-shaped electrode 503 and the lead-out electrode 504 are not limited specifically, and any materials that will not impair the effects of the present invention can be used.

Also, the metal bumps 505 for an electrical connection with an external circuit are formed on the lead-out electrodes 504. In the present embodiment, gold bumps are used as the metal bumps 505.

The circuit board 507 has the first wiring patterns 509 on one surface, the second wiring patterns 510 on the other surface and the internal circuits 514 therein. The first wiring pattern 509, the second wiring pattern 510 and the internal circuit 514 are connected by the via holes 511. A plurality of the mounted surface acoustic wave devices 501 and the external circuit are connected via these elements. In the present embodiment, the surface of the first wiring pattern 509 on the side that the surface acoustic wave device 501 is mounted is plated with gold. In addition, the internal circuit 514 is provided with a phase-shift circuit and passive elements such as a capacitor and an inductor.

Next, the method for manufacturing such a surface acoustic wave device built-in module will be described using FIGS. 6A to 6C.

First, as shown in FIG. 6A, the surface acoustic wave devices 501 are positioned and placed on the circuit board 507 so that the surface of the surface acoustic wave device 501 on the functional portion side faces the circuit board 507. Then, the metal bumps 505 of the surface acoustic wave devices 501 and the first wiring patterns 509 of the circuit board 507 are connected using heat and ultrasonic energy in combination.

In the present embodiment, the gold bumps are used as the metal bumps 505, but the present invention is not limited to them. For example, the gold bumps may be connected via an electrically conductive adhesive. Alternatively, solder bumps may be used as the metal bumps 505, and the connection may be made by reflowing the solder bumps.

Although the present embodiment illustrates the case in which the piezoelectric substrates 502 of a plurality of the mounted surface acoustic wave devices 501 have substantially the same thickness and are made of the same material, the present invention is not limited to this case. For example, a plurality of the surface acoustic wave devices 501 provided with the piezoelectric substrates 502 having different thicknesses and/or made of different materials may be mounted together. In addition, other than the surface acoustic wave devices 501, at least one of, for example, a semiconductor chip, a chip resistor, a chip capacitor and a chip inductor also may be mounted on the same circuit board 507.

On the circuit board 507 on which the surface acoustic wave devices 501 are mounted facedown as described above, the thermosetting resin composition 508 is applied and heated to be cured, thereby embedding and sealing the surface acoustic wave devices 501 (see FIG. 6B). The thermosetting resin composition 508 may be applied by overlaying a sheet-like object formed of the resin composition onto the surface on the nonfunctional portion side of the surface acoustic wave devices 501 or by printing an uncured paste-like object formed of this resin composition from the surface on the nonfunctional portion side of the surface acoustic wave devices 501 under a vacuum or reduced-pressure atmosphere, as described in the first embodiment. Alternatively, the resin composition is filled between the surface acoustic wave devices 501 and the circuit board 507 beforehand, and then the resin composition may be coated onto the surface on the nonfunctional portion side of the surface acoustic wave devices 501.

Since the surface acoustic wave devices 501 in the present embodiment are surrounded by the thermosetting resin composition 508 as described above, it is preferable to provide the functional portion with a space holding structure so that the functional portion of the surface acoustic wave device 501 does not contact this resin composition 508. This allows the resin to be filled also between the surface acoustic wave devices 501 and the circuit board 507, and thus an external force applied during a subsequent grinding or abrading process for reducing thickness can be supported not only by the metal bumps 505 but by the filled resin. As a result, stress is not concentrated in the vicinity of the metal bumps 505, thus preventing problems such as breakage of the piezoelectric substrate 502.

It is preferable that the holding body 506 forming the above-described space holding structure is formed of a film-like resin composition. This improves adhesion to the resin composition 508 surrounding the surface acoustic wave device 501, so that the holding body 506 and the resin composition 508 do not peel off from each other in the subsequent grinding or abrading process, making it possible to obtain a highly reliable component built-in module.

Next, the object in which the surface acoustic wave devices 501 are embedded with the resin composition 508 described above is ground or abraded from the surface opposite to the circuit board 507 so as to have a predetermined thickness. At this time, it is preferable that the grinding or abrading is carried out so as to roughen the surface on the nonfunctional portion side of the surface acoustic wave device 501. In the surface acoustic wave device 501, a surface elastic wave generated in the functional portion is propagated in the thickness direction of the piezoelectric substrate 502 and then reflected by the surface on the nonfunctional portion side so as to return to the functional portion, thus deteriorating characteristics. If the surface on the nonfunctional portion side is roughened, the influence of this reflected wave can be reduced, thereby obtaining a component built-in module having excellent frequency characteristics. It is particularly preferable that the surface on the nonfunctional portion side is roughened to have a roughness equal to or larger than a wavelength of the surface wave of the surface acoustic wave device. For example, when the applied frequency of the surface acoustic wave device is 100 MHz to 10 GHz and the propagation velocity is 4,000 m/s, the wavelength of its surface wave is 0.4 to 40 $\mu$m. Accordingly, in this case, it is preferable that the surface roughness Rz is at least 0.4 $\mu$m.

On the other hand, in the case where the surface of the piezoelectric substrate 502 formed of a piezoelectric single crystal is roughened, a work affected layer is formed on a work surface, thus deteriorating the characteristics of the surface acoustic wave device in some cases. The depth of the formed work affected layer increases consistently with the particle size of the grains used. As the roughness increases, it is more likely to cause breakage or microcrack of the piezoelectric substrate, thus lowering reliability. According to an experiment conducted by the inventors of the present invention, when the surface of the piezoelectric substrate 502 was roughened to have a roughness Rz of 50 $\mu$m or larger, the frequent occurrence of the substrate breakage and characteristics deterioration was observed, presenting difficulty in obtaining a thin component built-in module.

On the other hand, as the surface roughness is reduced, a frictional stress during the grinding or abrading increases, breaking the connected portion between the surface acoustic wave devices 501 and the circuit board 507, that is, the connection between the lead-out electrodes 504 and the metal bumps 505 or that between the metal bumps 505 and the first wiring patterns 509. The amount of heat generated during the grinding or abrading also increases, so that the generated heat adversely affects the surface acoustic wave devices 501 and cracks occur at the interface between the surface acoustic wave devices 501 and the resin composition 508. According to an experiment conducted by the inventors of the present invention, when the surface of the piezoelectric substrate 502 was roughened to have a roughness Rz of 0.5 $\mu$m or smaller, the frequent occurrence of these problems was observed, presenting difficulty in obtaining a thin component built-in module.

Thus, when considering the deterioration in characteristics of the surface acoustic wave device 501, the breakage of the piezoelectric substrate 502 and the decrease in the connection reliability, it is preferable that the surface of the surface acoustic wave device 501 is ground or abraded so that the surface roughness Rz ranges from 0.5 to 50 $\mu$m. It is more preferable that not only the surface of the surface acoustic wave device 501 but also that of the thermosetting resin composition 508 is ground or abraded so that their surface roughness Rz ranges from 0.5 to 50 $\mu$m.

In this manner, the module containing the surface acoustic wave devices as shown in FIG. 5 is obtained.

According to the present invention, by sealing the mounted surface acoustic wave devices with the thermosetting resin composition and grinding or abrading the surface on the nonfunctional portion side of the surface acoustic wave device together with the thermosetting resin composition so as to be flush with each other, it becomes possible to reduce the thickness of the surface acoustic wave device easily, which has been difficult conventionally, thereby obtaining a thin surface acoustic wave device built-in module.

Also, by providing the functional portion formed on the surface of the surface acoustic wave device with the space holding structure for preventing the excitation and propagation of the surface elastic wave from being obstructed, it becomes possible to fill the surface on the functional portion side of the surface acoustic wave device with the resin composition, so that breakage etc. do not occur in the surface acoustic wave device during the grinding or abrading process.

Furthermore, by forming the space holding structure with the film-like resin composition, it becomes possible to obtain a highly reliable surface acoustic wave device built-in module having a high affinity for the above-described resin composition for sealing.

In addition, the surfaces of the surface acoustic wave device and the thermosetting resin composition that are formed to be flush with each other have a roughness Rz ranging from 0.5 to 50 μm, thereby obtaining a thin surface acoustic wave device built-in module without affecting characteristics of the surface acoustic wave device. At the same time, it is possible to obtain a highly reliable surface acoustic wave device built-in module that has a high connection reliability with the metal bumps and can prevent the substrate from breaking and being affected.

Although the semiconductor chips 203 were mounted on the wiring patterns 201 on the support 200 in the first embodiment, they may be mounted on the circuit board 507 as illustrated in the third embodiment. Similarly, although the surface acoustic wave devices 501 were mounted on the circuit board 507 in the third embodiment, they may be mounted on the wiring patterns 201 on the support 200 as illustrated in the first embodiment.

EXAMPLES

In the following, specific examples will be described in detail.

First Example

The following is a description of an example corresponding to the first embodiment described above.

First, the method for producing the copper-foil support 200, shown in FIG. 2A, whose surface is provided with the wiring patterns 201 will be explained.

An existing copper foil for a circuit board can be used for the copper-foil support 200. Such a copper foil was produced by rotating a drum electrode in an electrolyte and continuously reeling in a copper plating layer formed on this drum. At this time, by adjusting the current value and the rotation speed for forming the plating layer, it was possible to form a copper foil with a desired thickness continuously. The thickness of the copper foil used here was 70 μm.

Next, a peel-off layer for a later transferring was formed by forming an extremely thin organic layer on the surface of this copper-foil support 200 or by plating metal that is different from the copper, such as nickel or tin, thinly thereon. The transferring is possible even when the peel-off layer is not formed, but with this peel-off layer, over-etching can be prevented at the time of forming the wiring patterns 201 by etching. Alternatively, without forming the peel-off layer, the copper-foil support 200 also is etched slightly, thereby embedding the transferred wiring patterns 201 into the sheet-like object 204. In the present example, the copper-foil support 200 was provided with the peel-off layer, further followed by copper plating to be the wiring pattern. The thickness of the copper plating layer was 12 μm. Thereafter, the copper plating layer was etched to achieve a predetermined pattern, thus obtaining the wiring patterns 201.

On the copper-foil support 200 having the wiring patterns 201 formed of the copper plating layer produced as above, the semiconductor chips 203 were mounted by a flip-chip method. The semiconductor chip 203 used here was a silicon memory semiconductor having a thickness of 0.3 mm and a horizontal size of 10 mm×10 mm.

The mounting method follows. First, gold wires having a diameter of 25 μm were bonded to aluminum electrodes of the semiconductor chip 203 (a first bonding), and then gold wires further were bonded to the first bonding (a second bonding). Thus, two-stage protruding gold bumps were formed. Since the formed gold bumps did not have a uniform height, a die was pressed against a group of the gold bumps on the semiconductor chip with a predetermined pressure, so as to even up the heights, which was called leveling. The surface on the gold bumps 202 side of the semiconductor chip 203 produced as above was pressed into contact with an electrically conductive paste that had been provided to be a uniform thickness on a flat plate by squeezing, thus applying the electrically conductive paste on tips of the two-stage protruding gold bumps 202.

The semiconductor chips 203 produced as above were positioned and superimposed on the wiring patterns 201, further heated to cure the electrically conductive paste, and then the gold bumps 202 and the wiring patterns 201 were electrically connected via the electrically conductive paste (see FIG. 2B).

Next, the gaps between the copper-foil support 200 having the wiring patterns 201 and the semiconductor chips 203 were sealed with a liquid resin. The resin used here was a paste-like resin obtained by mixing silica particles for controlling the coefficient of thermal expansion into a liquid epoxy resin. This resin was dropped in the gap between the semiconductor chips 203 and the wiring patterns 201, thereby making a seal utilizing a surface tension. The sealing resin is not always needed, but is preferable in terms of work efficiency because it can reinforce a connected portion mechanically so as not to cause problems in the connected portion of the electrically conductive paste owing to an external force applied in a later process.

Subsequently, on the semiconductor chips 203 mounted on the copper-foil support 200, the sheet-like object 204 formed of a mixed composition of an inorganic filler and a thermosetting resin was overlaid, followed by heating and compression, thereby embedding the semiconductor chips 203 into the sheet-like object 204.

The producing method for the sheet-like object used here follows.

The following is a blend composition of the resin composition contained in the sheet-like object.

(1) Inorganic filler:
$Al_2O_3$ 90 wt %
(AS-40 manufactured by Showa Denko K.K., spherical particles, 12 μm)
(2) Thermosetting resin:
Liquid epoxy resin 9.5 wt %
(EF-450 manufactured by Japan Rec Co., Ltd.)
(3) Others:
Carbon black 0.2 wt %
(manufactured by Toyo Carbon Co., Ltd.)
Coupling agent 0.3 wt %
(46B, titanate-based coupling agent manufactured by Ajinomoto Co., Inc.)

The inorganic filler and the liquid thermosetting resin etc. that had been weighed according to the above composition were put into a container with a predetermined capacity. Then, this container was set in a stirrer so that the content was mixed. The stirrer used here rotates the container itself while rotating it around the axis of the stirrer, thereby obtaining a sufficiently dispersed state within a short period of time such as 10 minutes even when the content has a relatively high viscosity.

A predetermined amount of the paste-like mixed resin composition obtained as above was dropped on a release film. A polyethylene terephthalate film having a thickness of 75 μm whose surface had been subjected to a release treatment with silicon was used as the release film. On the resin composition dropped on the release film, another release film further was overlaid and pressed by a pressing machine to achieve a predetermined thickness. Next, the resin composition sandwiched by the two release films was heated together with the release films under the condition that the viscosity is reduced sufficiently.

The condition of the heat treatment was to hold them at 120° C. for 15 minutes. Thereafter, the release films on both sides were peeled off, thus obtaining the sheet-like object 204 having a thickness of 500 μm and sufficiently low viscosity. Since the thermosetting epoxy resin used here has a cure starting temperature of 130° C., it is uncured (in a B stage) under the heat treatment condition mentioned above and can be melted again by heating in a later process.

The copper-foil support 200 on which the semiconductor chips 203 were mounted was set in a die, and the above-described sheet-like object 204 further was placed thereon. The die was heated to 150° C. and pressurized at $9.8 \times 10^6$ Pa (100 kg/cm). The holding time was 15 minutes. In this manner, as shown in FIG. 2D, the semiconductor chips 203 were embedded into the sheet-like object 204 and the sheet-like object 204 was cured.

Subsequently, this semiconductor chip built-in object was abraded from a back side of the semiconductor chips 203 (the side opposite to the copper-foil support 200). The semiconductor chip built-in object was abraded to have a thickness of 170 μm using a regular lapping machine. It was abraded with the copper-foil support 200 being adhered thereto as shown in FIG. 2E. This was because the wiring patterns 201 can be prevented from being contaminated by abrasives and water entering during the abrading.

After being abraded to have a predetermined thickness, the semiconductor chip built-in object was washed, and then the copper-foil support 200 was peeled off (see FIG. 2F). Because the copper-foil support 200 had a smooth surface, it was peeled off easily even when the sheet-like object 204 was in a cured state.

Since the ultra-thin semiconductor chip built-in module 210 that was produced as above contained alumina as the inorganic filler in the sheet-like object 204, it was possible to obtain a thermal conductivity that was at least about 20 times as large as that of a conventional glass-epoxy substrate. The semiconductor chip built-in module 210 was produced in a similar manner using various types of inorganic fillers instead of alumina, and it was found that the use of AlN and MgO brought about the thermal conductivity equal to or larger than that in the case of alumina.

Also, when using an amorphous $SiO_2$ as the inorganic filler in the sheet-like object 204, it was possible to achieve a coefficient of thermal expansion for the sheet-like object 204 close to that of a silicon semiconductor. Thus, it was found to have a potential as a substrate for a flip-chip mounting on which semiconductor chips were mounted directly.

By using AlN having an excellent thermal conductivity, it was possible to obtain a thermal conductivity close to that of a ceramic substrate.

When BN was added, it was possible to obtain a high thermal conductivity and a low coefficient of thermal expansion. Especially when the BN content was equal to or larger than 85 wt %, it was possible to achieve an excellent thermal conductivity and a low cost, and therefore it was found to have a potential as a highly thermal-conductive module.

Also, the system using $SiO_2$ obtained a dielectric constant lower than the others and a small specific gravity, and therefore, it was found to be effective in high frequency applications such as a mobile phone.

On the wiring patterns 201 that are exposed by peeling off the copper-foil support 200 as shown in FIG. 2F, a semiconductor chip or an electronic component further can be mounted. This makes it possible to obtain a semiconductor chip built-in module mounted with an extremely high density. In this case, the material for the inorganic filler can be selected according to a component to be mounted.

Furthermore, there also is a special effect that the module on which a plurality of the semiconductor chips are mounted as shown in FIG. 3A is divided into many pieces by a slicer, thereby obtaining a chip size package as shown in FIG. 3B in a simple manner.

In the above example, when embedding the mounted semiconductor chips 203 into the sheet-like object 204, the sheet-like object 204 was cured while being compressed at 150° C. As another example, the semiconductor chips 203 were embedded by applying a pressure for 2 minutes at 100° C., which was lower than a cure starting temperature of the thermosetting resin, so as to reduce a melt viscosity of the thermosetting resin, and then the pressure was released and the temperature was raised to 150° C. to cure the resin. In this case, similarly to the above example, it also was possible to produce a semiconductor chip built-in module without any problems.

In this further example, the process of embedding the semiconductor chips and that of curing the thermosetting resin are carried out separately. Since it is possible to perform the embedding process, which requires compression, within a short period of time by reducing the melt viscosity and then to batch the subsequent curing processes altogether, the total time necessary can be shortened.

In addition, although the semiconductor chips 203 were mounted using the electrically conductive paste in the above example, they may be connected by a flip-chip mounting method using a solder bump or by compressing a thermosetting resin sheet in which an electrically conductive filler is dispersed by the bumps 202 so as to produce an electrical conductivity only in the portion of the bumps 202. These are advantageous economically because they eliminate the need for above-described resin sealing between the copper-foil support 200 and the semiconductor chips 203.

Second Example

The following is a description of an example corresponding to the second embodiment described above. Illustrated is an example of manufacturing a semiconductor chip built-in module having a multilayered structure using an abraded semiconductor chip built-in module 210 that has been produced by a method similar to the first example.

As shown in FIG. 4A, the semiconductor chip built-in module 210 that had been produced in the first example, the prepreg 401 for the circuit board and the copper foil 405 were multilayered.

The prepreg 401 for the circuit board was obtained by impregnating a glass fabric with an epoxy resin so as to be in the B stage. The thickness thereof was 100 μm. This prepreg was cut into a predetermined size, and then through holes having a diameter of 0.15 mm were formed at a constant pitch of 0.2 to 2 mm using a carbon dioxide gas laser.

Using a three roll mill, 85 wt % of spherical copper particles, 3 wt % of bisphenol A type epoxy resin (Epikote 828 manufactured by Yuka Shell Epoxy Co., Ltd.) and 9 wt % of glycidyl ester epoxy resin (YD-171 manufactured by Thto Kasei Co., Ltd.) as a resin composition and 3 wt % of amine adduct hardener (MY-24 manufactured by Ajinomoto Co., Inc.) as a hardener were mixed, thus obtaining the electrically conductive paste 403 for filling a via hole. This electrically conductive paste 403 was filled in the through holes formed in the prepreg 401 by screen printing.

As shown in FIG. 4A, the semiconductor chip built-in module 210 was positioned and superimposed on one surface of the prepreg 401 produced as above, and single-sided roughened copper foil (the roughened surface was the one facing the prepreg 401) having a thickness of 35 μm was positioned and superimposed on the other side thereof, and heated at 170° C. and compressed at $4.9 \times 10^6$ Pa (50 kg/cm) for 60 minutes using a hot press.

Thus, the thermosetting resin in the prepreg 401 was heated to be cured, so that the semiconductor chip built-in module 210 and the copper foil 405 were adhered thereto. At the same time, the thermosetting resin in the electrically conductive paste 403 filled in the through holes was cured, so that the wiring patterns 201 and the copper foil 405 were connected electrically (see FIG. 4B).

The copper foil 405 adhered on the surface by the curing of the prepreg 401 was etched by an etching technique, thus forming the wiring patterns 407 (see FIG. 4C).

As a test for evaluating the reliability of the semiconductor chip built-in module produced in the present example, a solder reflow test and a temperature cycling test were carried out. In the solder reflow test, the module was passed 10 times through a high temperature atmosphere at a maximum temperature of 260° C. for 10 seconds using a belt-type reflow tester. In the temperature cycling test, a cycle of allowing the module to stand at 125° C. for 30 minutes as a high temperature side and then at 60° C. for 30 minutes as a low temperature side was repeated 200 times.

The results showed that, in both of these tests, no change in the shape such as cracks was generated in the semiconductor chip built-in module of the present example, and no specific defect was recognized by an ultrasonic reflectoscope. Accordingly, it was found that the semiconductor chips 203 and the resin composition 204 adhered to each other tightly. In addition, the resistance of an inner-via-hole connection by the electrically conductive paste 403 did not change substantially from its initial performance.

By further repeating the process of laminating the prepreg for the circuit board 401 whose through holes are filled with the electrically conductive paste 403 and the copper foil 405 onto the surface on the wiring pattern 407 side, it was possible to produce a semiconductor chip built-in module having a multilayered wiring structure. This achieved a still higher-density wiring module.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. An electric element built-in module comprising:
   wiring patterns;
   at least two electric elements mounted on the wiring patterns; and
   a thermosetting resin composition for sealing the electric elements;
   wherein upper surfaces of the at least two electric elements and an upper surface of the thermosetting resin composition are substantially flush with each other and the upper surfaces of the at least two electric elements and the upper surface of the thermosetting resin composition have a surface roughness Rz of 0.5 to 50 μm.

2. The electric element built-in module according to claim 1, wherein at least one of the electric elements comprises a functional portion and a connection electrode on a surface on a side of the wiring pattern, and the connection electrode is connected to the wiring pattern.

3. The electric element built-in module according to claim 1, wherein at least one of the electric elements is at least one element selected from the group comprising of a semiconductor chip, a chip resistor, a chip capacitor and a chip inductor.

4. The electric element built-in module according to claim 1, wherein at least one of the electric elements is a surface acoustic wave device.

5. The electric element built-in module according to claim 4, wherein a surface of the surface acoustic wave device on the side of the wiring pattern is provided with a functional portion and a space holding structure for preventing excitation and propagation of a surface elastic wave from being obstructed in the functional portion.

6. The electric element built-in module according to claim 5, wherein the space holding structure is formed of a film-like resin composition.

7. The electric element built-in module according to claim 1, wherein the thermosetting resin composition contains an inorganic filler and a thermosetting resin.

8. The electric element built-in module according to claim 7, wherein the thermosetting resin contains an epoxy resin, a phenolic resin or a cyanate resin as a main component.

9. The electric element built-in module according to claim 7, wherein the inorganic filler is at least one inorganic filler selected from the group consisting of $Al_2O_3$, MgO, BN, AlN and $SiO_2$.

10. The electric element built-in module according to claim 1, wherein the wiring pattern is formed on a surface of a circuit board.

11. The electric element built-in module according to claim 1, wherein the wiring pattern is formed on a surface of a support.

12. The electric element built-in module according to claim 11, wherein the support is formed of an organic film or a metal foil.

13. The electric element built-in module according to claim 1, wherein at least one of the electric elements is connected to the wiring pattern via a bump.

14. The electric element built in module according to claim 1, wherein the upper surfaces of the at least two electric elements and the upper surface of the thermosetting resin composition are ground or abraded.

15. The electric element built in module according to claim 1, wherein the thermosetting resin composition contains 70 to 95 wt % of an inorganic filler and 5 to 30 wt % of thermosetting resin.

* * * * *

UNITED STATES PATENT AND TRADEMARK OFFICE
CERTIFICATE OF CORRECTION

PATENT NO. : 6,798,121 B2
DATED : September 28, 2004
INVENTOR(S) : Nakatani et al.

It is certified that error appears in the above-identified patent and that said Letters Patent is hereby corrected as shown below:

Column 24,
Line 17, "group comprising of a" should read -- group consisting of a --

Signed and Sealed this

Seventh Day of June, 2005

JON W. DUDAS
*Director of the United States Patent and Trademark Office*